(12) United States Patent
Chen et al.

(10) Patent No.: US 8,927,087 B2
(45) Date of Patent: *Jan. 6, 2015

(54) BONDING OF SUBSTRATES INCLUDING METAL-DIELECTRIC PATTERNS WITH METAL RAISED ABOVE DIELECTRIC AND STRUCTURES SO FORMED

(71) Applicant: International Business Machines Corporation, Armonk, NY (US)

(72) Inventors: Kuan-Neng Chen, Hsinchu (TW); Bruce K. Furman, Plattsburgh, NY (US); Sampath Purushothaman, Yorktown Heights, NY (US); David L. Rath, Stormville, NY (US); Anna W. Topol, Wappingers Falls, NY (US); Cornelia K. Tsang, Mohegan Lake, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/028,974

(22) Filed: Sep. 17, 2013

(65) Prior Publication Data
US 2014/0097543 A1    Apr. 10, 2014

Related U.S. Application Data

(62) Division of application No. 13/443,418, filed on Apr. 10, 2012, now Pat. No. 8,617,689.

(51) Int. Cl.
*B32B 3/00* (2006.01)
*B32B 15/04* (2006.01)
*B23K 20/24* (2006.01)
*H01L 23/00* (2006.01)
*B23K 20/233* (2006.01)
*B23K 20/02* (2006.01)

(52) U.S. Cl.
CPC ............... *H01L 24/05* (2013.01); *B23K 20/24* (2013.01); *B23K 20/233* (2013.01); *B23K 20/023* (2013.01); *H01L 24/12* (2013.01); *B23K 2201/42* (2013.01)
USPC ........... 428/172; 428/156; 428/161; 428/164; 428/457

(58) Field of Classification Search
CPC ............ B32B 15/00; B32B 3/30; B32B 3/28; B32B 3/00; H01L 24/12; H01L 24/05; H01L 21/30; H01L 21/4763; H01L 21/46; H01L 21/44; H01L 23/52
USPC .......... 428/156, 161, 164, 172, 457; 257/777, 257/758, 734, 735, 736, 737, 738, 739, 257/750; 438/455, 687, 637, 108, 109, 612, 438/614
See application file for complete search history.

(56) References Cited

U.S. PATENT DOCUMENTS

| 4,444,352 A | 4/1984 | Glascock, II et al. |
| 7,354,798 B2 | 4/2008 | Pogge et al. |

(Continued)

OTHER PUBLICATIONS

U.S. Appl. No. 11/532,599, filed Sep. 18, 2006, Office Action dated Oct. 14, 2011.

(Continued)

*Primary Examiner* — Catherine A Simone
(74) *Attorney, Agent, or Firm* — Vazken Alexanian; Hoffman Warnick LLC

(57) ABSTRACT

Bonding of substrates including metal-dielectric patterns on a surface with the metal raised above the dielectric, as well as related structures, are disclosed. One structure includes: a first substrate having a metal-dielectric pattern on a surface thereof, the metal-dielectric pattern including: a metal having a concave upper surface; and a dielectric having a substantially uniform upper surface, wherein the metal on the first substrate is raised above the dielectric on the first substrate; and a second substrate bonded with the first substrate, the second substrate including: a dielectric; and a metal positioned substantially below the dielectric of the second substrate, wherein the first substrate and the second substrate are bonded only at the metal from the first substrate and the metal from the second substrate.

14 Claims, 17 Drawing Sheets

(56) References Cited

U.S. PATENT DOCUMENTS

| | | | |
|---|---|---|---|
| 7,566,632 | B1 | 7/2009 | Rothwell et al. |
| 7,855,455 | B2 | 12/2010 | Purushothaman et al. |
| 8,617,689 | B2 * | 12/2013 | Chen et al. .................... 428/172 |
| 2002/0003307 | A1 | 1/2002 | Suga |
| 2003/0157782 | A1 | 8/2003 | Kellar et al. |
| 2004/0048459 | A1 | 3/2004 | Patti |
| 2004/0102028 | A1 | 5/2004 | Hsieh et al. |
| 2004/0251552 | A1 | 12/2004 | Takewaki et al. |
| 2005/0221581 | A1 | 10/2005 | RamachandraRao et al. |
| 2008/0006938 | A1 | 1/2008 | Patti et al. |

OTHER PUBLICATIONS

U.S. Appl. No. 11/532,599, filed Sep. 18, 2006, Office Action May 13, 2011.

U.S. Appl. No. 11/532,599, filed Sep. 18, 2006, Office Action dated Nov. 24, 2010.

Chen, et al., "Temperature and Duration Effects on Microstructure Evolution during Copper Wafer Bonding", Journal of Electronic Materials, vol. 32, No. 12, 2003.

Itoh, et al., "Room Temperature Vacuum Sealing Using Surface Activated Bonding Method", IEEE, 2003.

Chen et al, "Improved Manufacturability of Cu Bond Pads and Implementation of Seal Design in 3D Integrated Circuits and Packages" Sep. 2006.

Unknown, "Direct Bond Interconnect (DBI)", Ziptronix, 2006.

U.S. Appl. No. 11/532,599, Notice of Allowance and Fees Due dated Apr. 3, 2012.

Simone, U.S. Appl. No. 13/443,418, Office Action Communication, May 30, 2013, 7 pages.

Simone, U.S. Appl. No. 13/443,418, Office Action Communication, Oct. 26, 2012, 11 pages.

Simone, U.S. Appl. No. 13/443,418, Notice of Allowance and Fees Due dated Aug. 21, 2013.

* cited by examiner

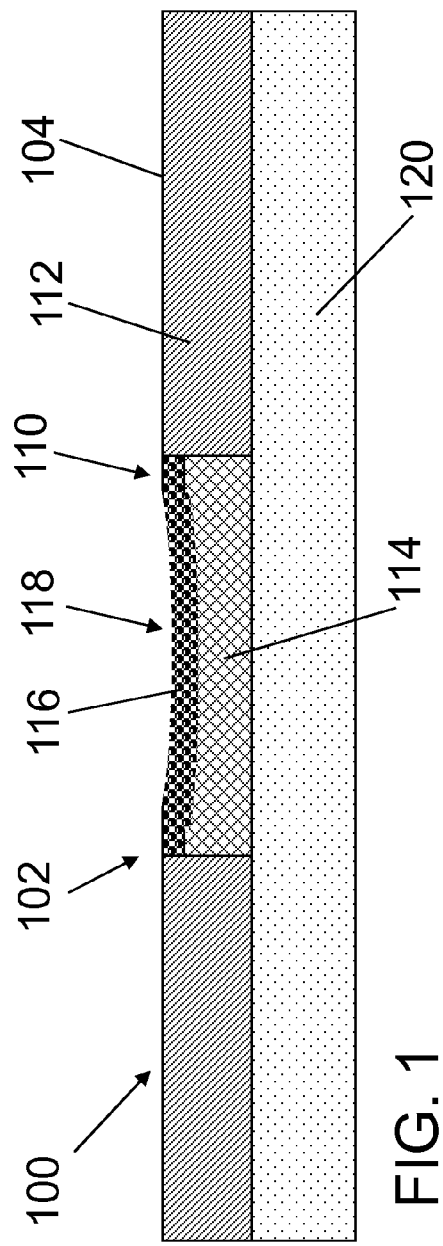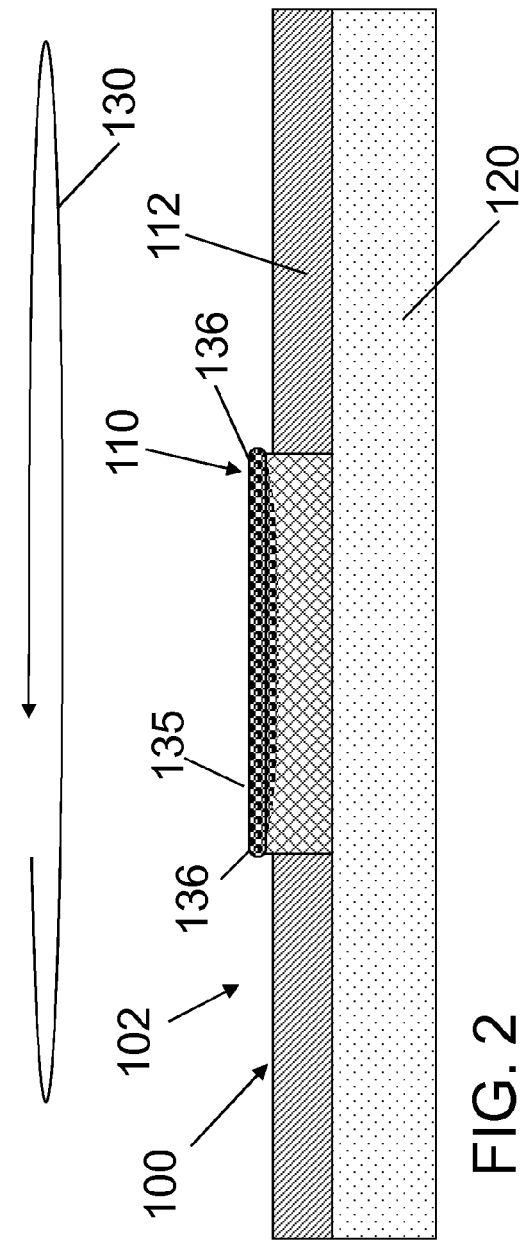

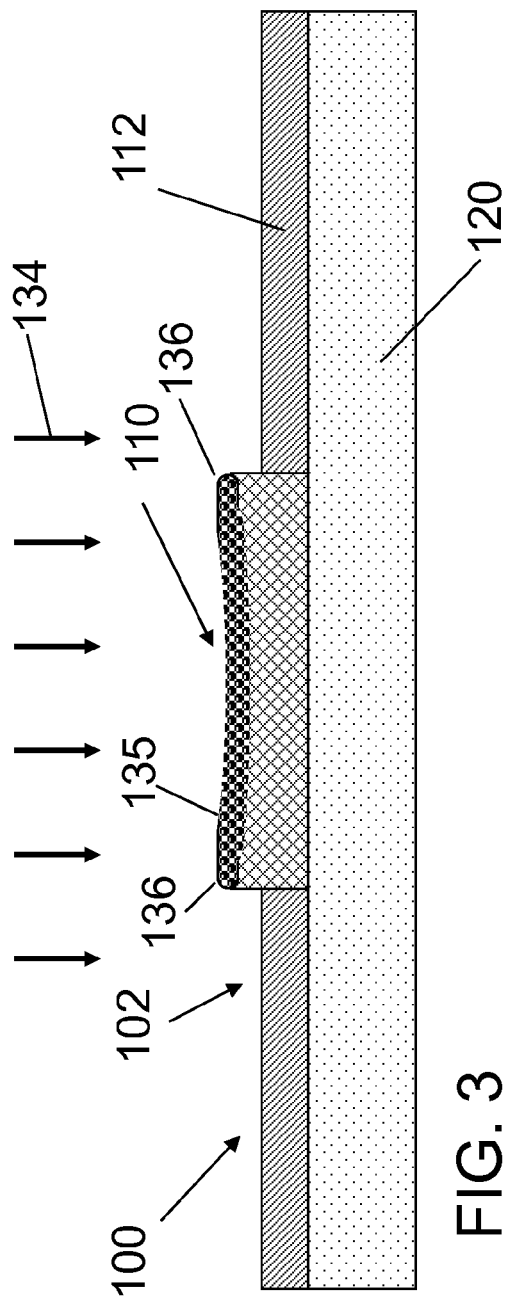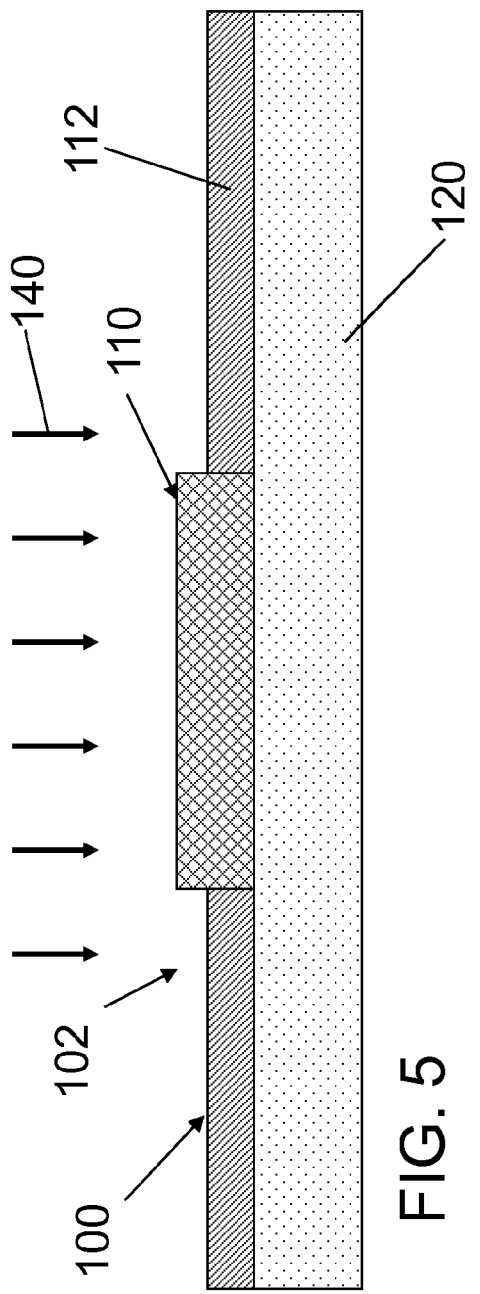

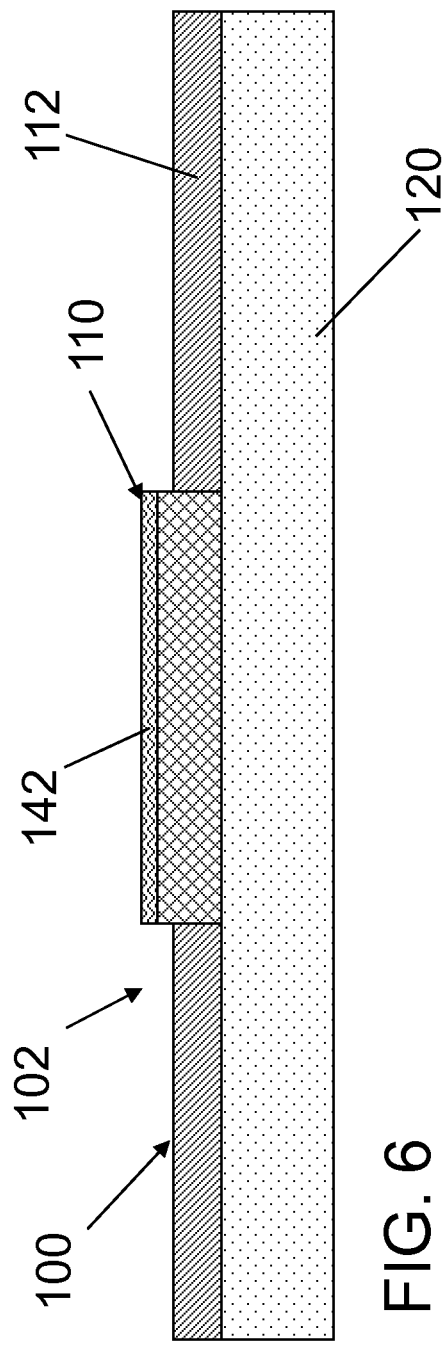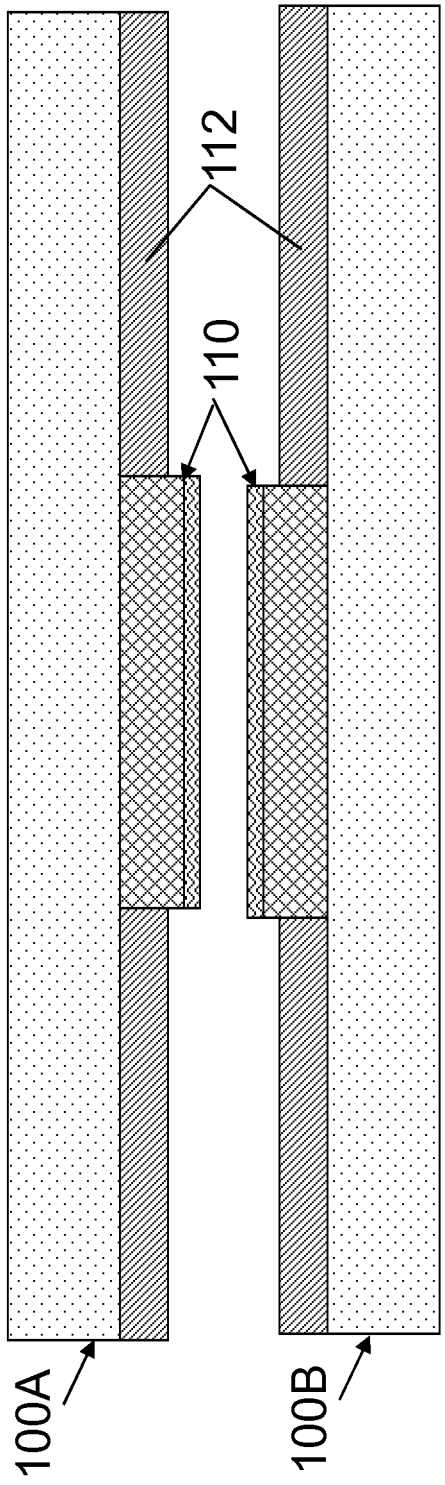
FIG. 6
FIG. 7

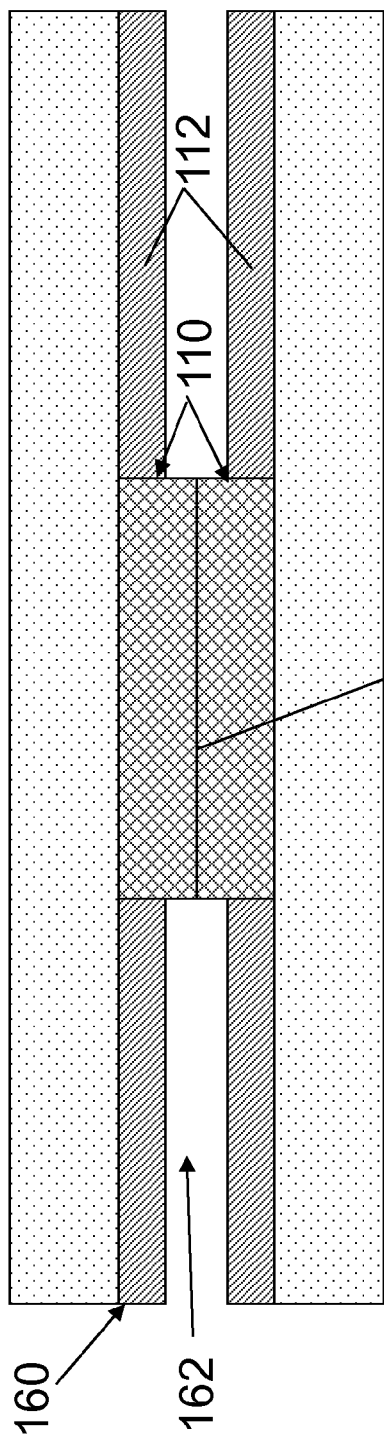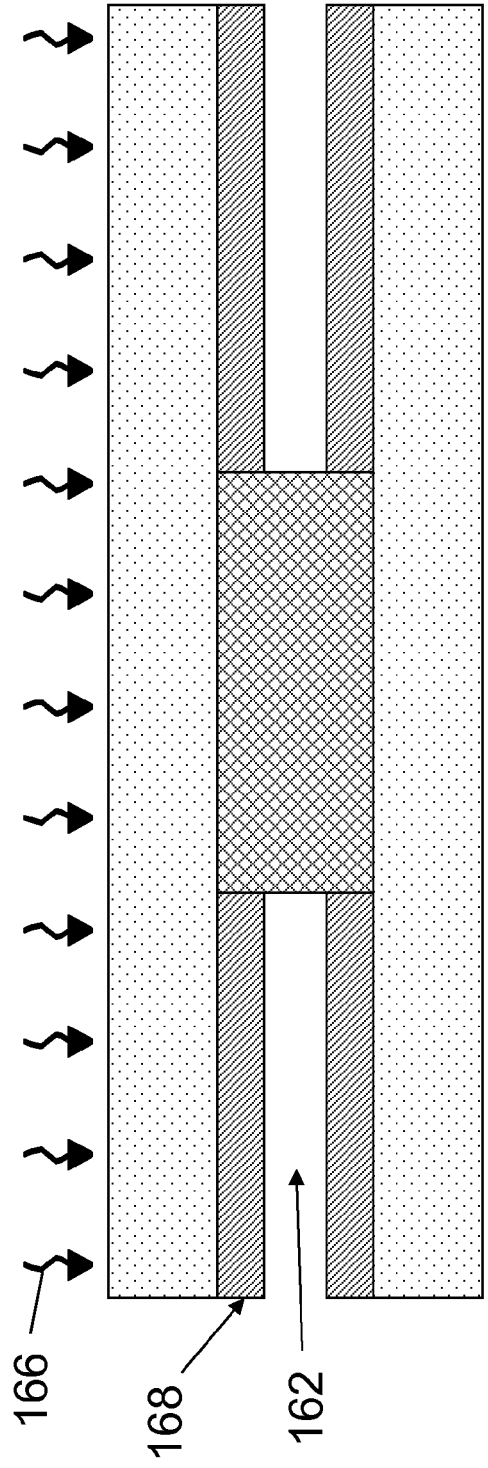

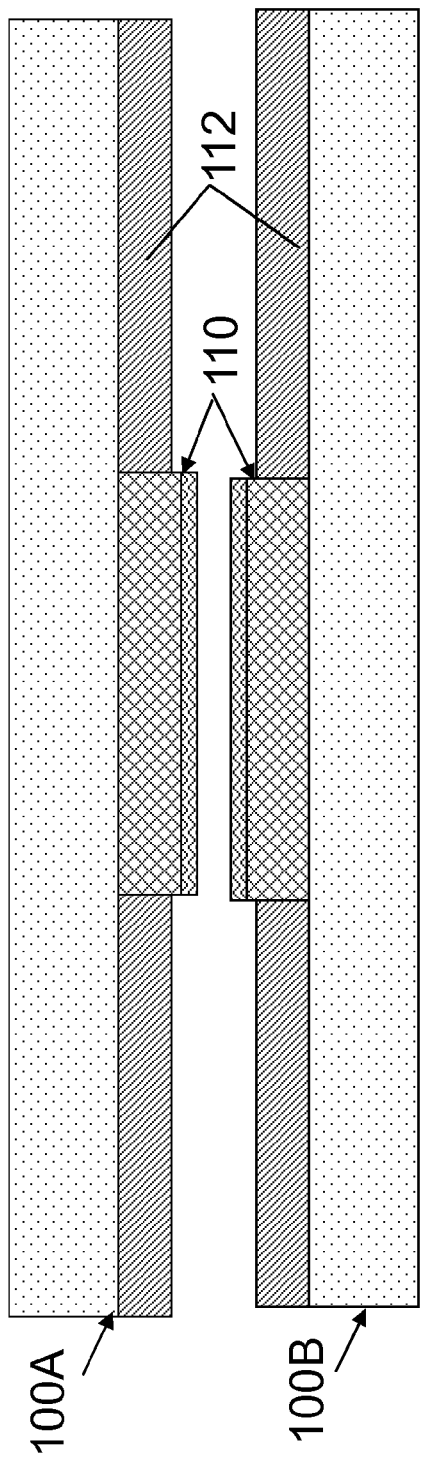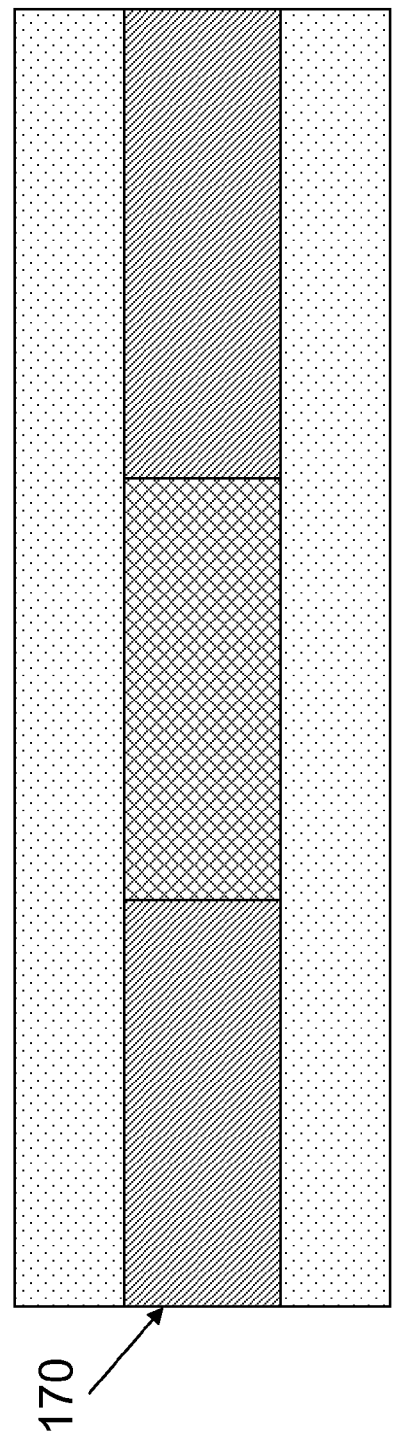
FIG. 10
FIG. 11

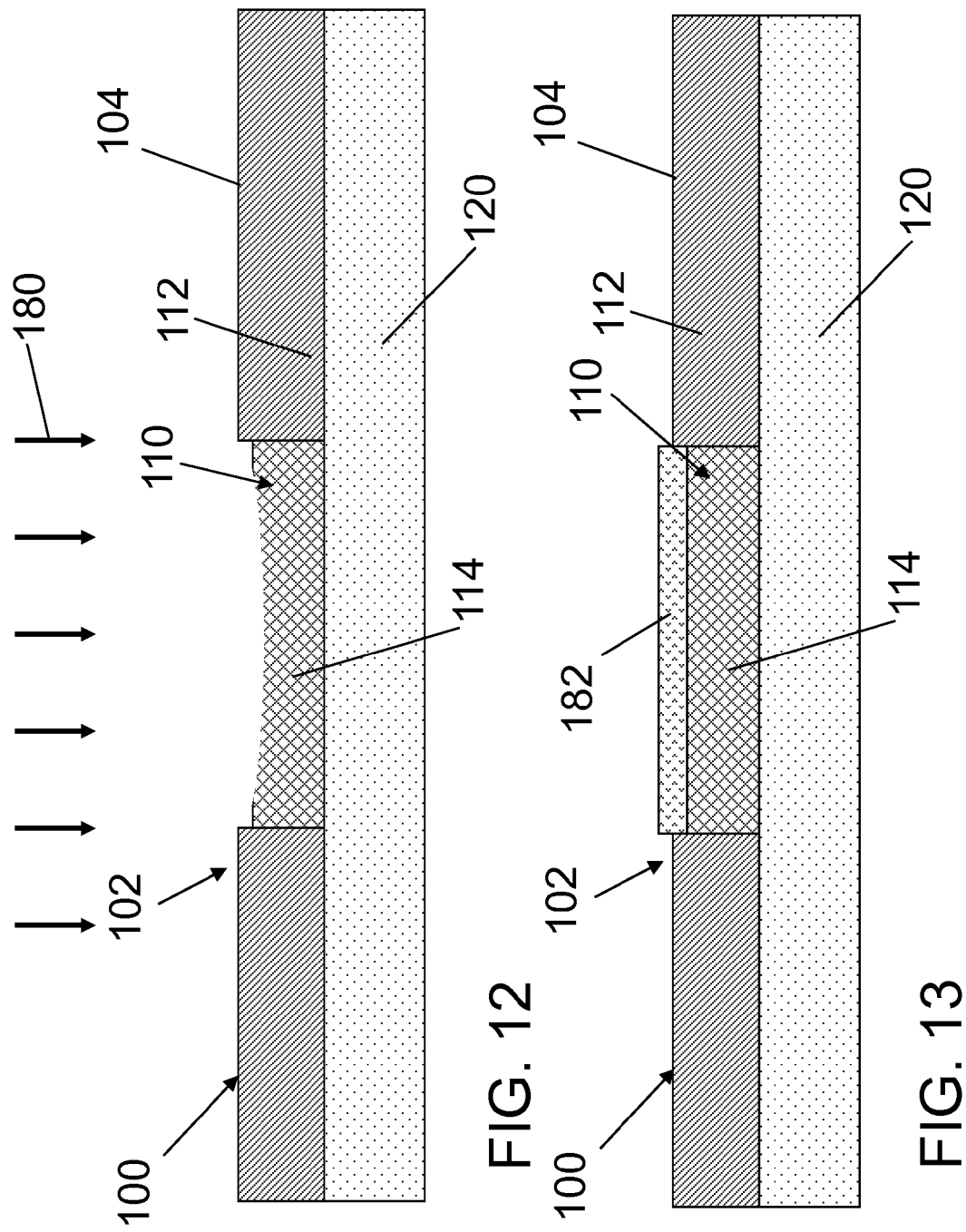

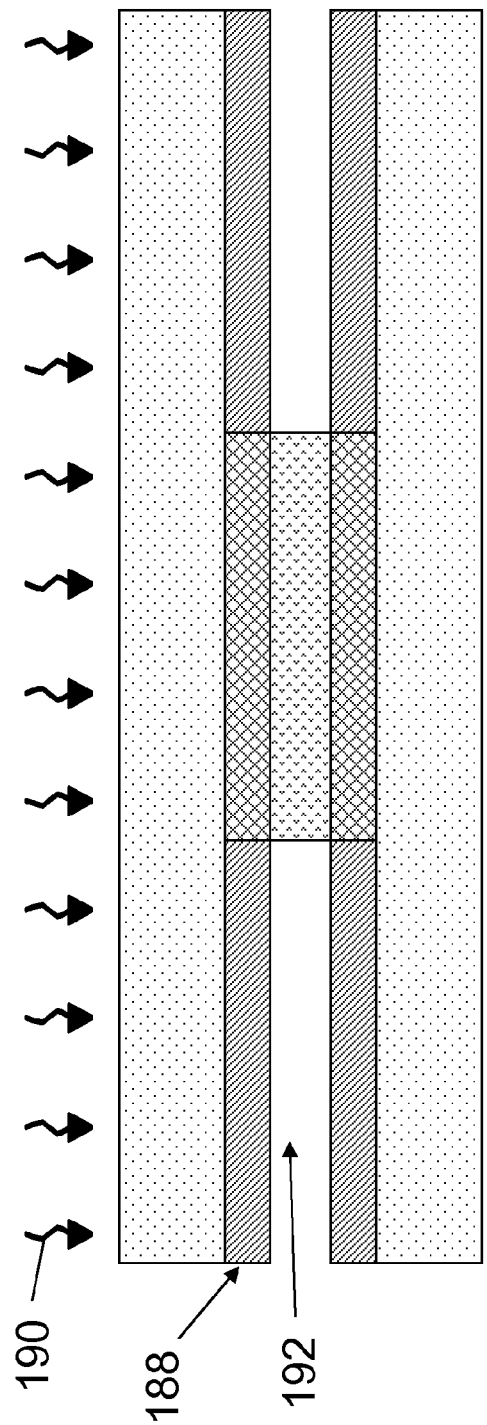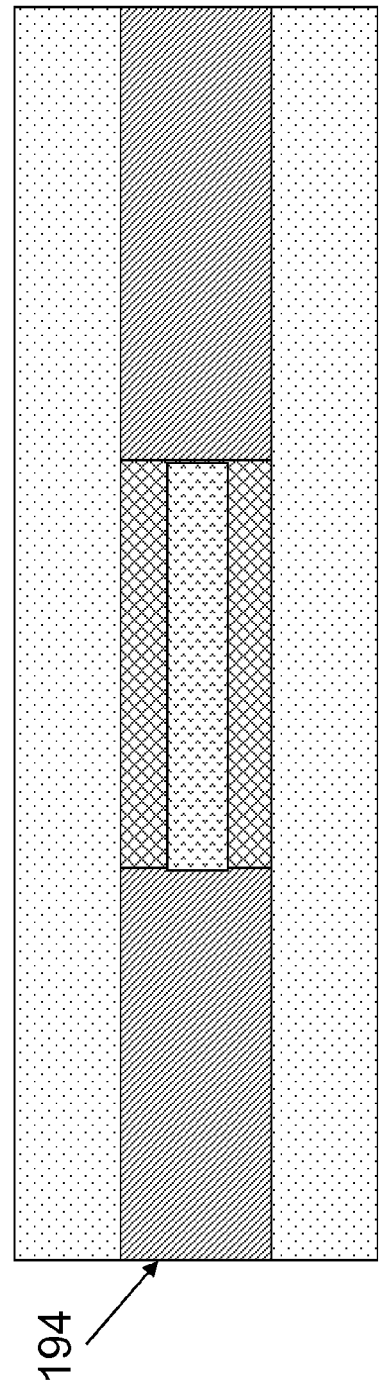
FIG. 16A
FIG. 17A

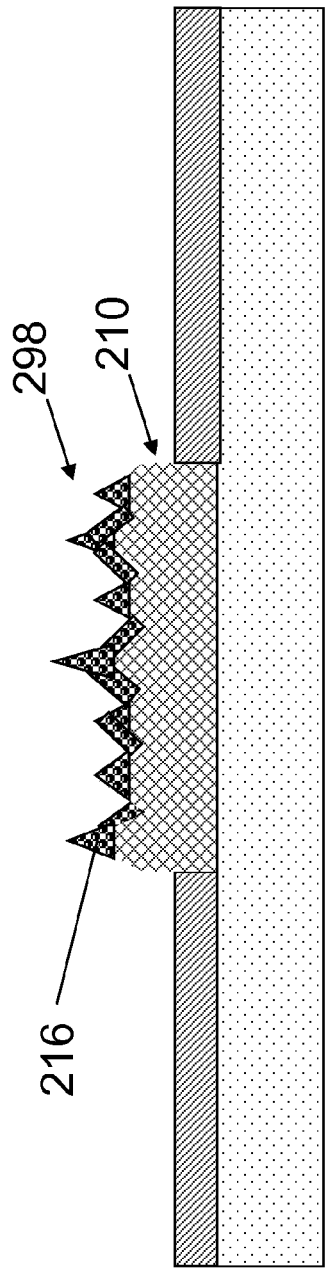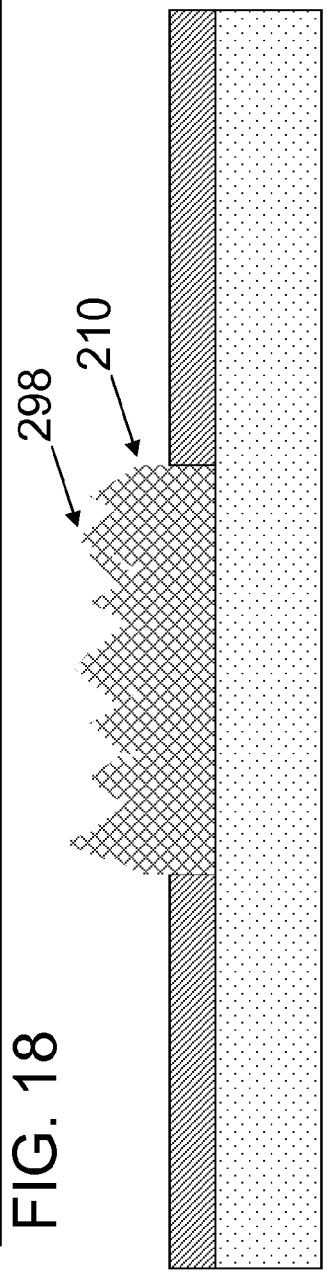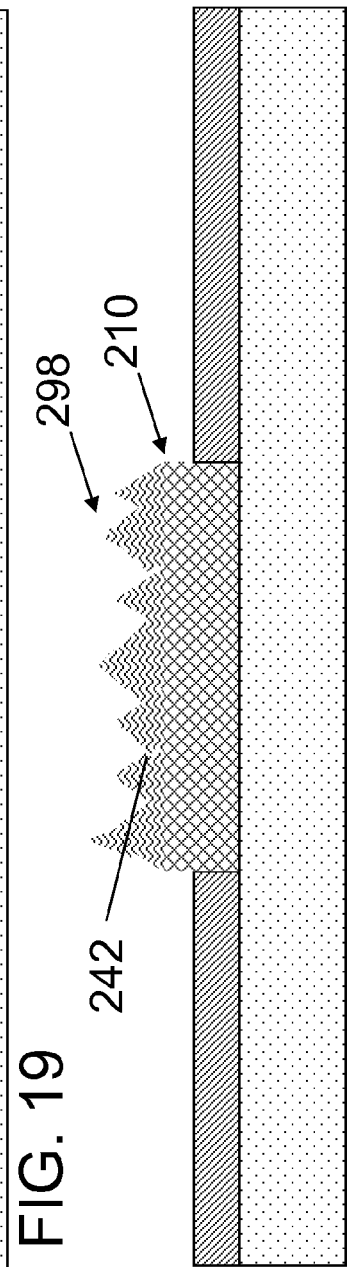

BONDING OF SUBSTRATES INCLUDING METAL-DIELECTRIC PATTERNS WITH METAL RAISED ABOVE DIELECTRIC AND STRUCTURES SO FORMED

CROSS-REFERENCE TO RELATED APPLICATIONS

This application is a continuation of currently pending U.S. patent application Ser. No. 13/443,418, which is hereby incorporated by reference in its entirety.

GOVERNMENT INTEREST

This invention was made with government support under contract numbers: N66001-00-C-8003 and N66001-04-C-8032 of the Defense Advanced Research Projects Agency (DARPA). The government has certain rights to this invention.

BACKGROUND OF THE INVENTION

1. Technical Field

The invention generally relates to the integrated circuit fabrication and, more specifically, to bonding of substrates having metal-dielectric patterns.

2. Background Art

In the integrated circuit fabrication industry, substrate bonding is used to join various parts of an integrated circuit (IC) together. Thermal-compression bonding is one type of bonding that is advantageous because it allows the use of metals at the bonding interface rather than just dielectrics. The metallic surface serves as a good bonding medium, and also provides additional functionality such as electrical signal propagation and thermal spreading. Unfortunately, thermal compression bonding presents many challenges in order to achieve a good quality bond.

One challenge is optimizing process parameters. Process parameters may include, for example, surface preparation before bonding such as cleans and wetting treatments, process conditions during bonding such as temperature, pressure, force, time, etc., and post-bonding treatments such as thermal cycles.

Another challenge is addressing patterned metal-dielectric mating surfaces that typically include topography, which prevents a reliable bond. In particular, metal-dielectric patterning is conventionally formed using damascene processing. Damascene processing involves fabricating interconnect metal lines by forming and filling trenches in a dielectric, and attempting to planarize the surface by chemical-mechanical polishing (CMP). Bonding of patterned surfaces takes place after the CMP step. CMP, however, leaves the metal surface non-uniform, e.g., the metal is typically concave and non-planar relative to the dielectric. As a result, the topographical differences between bonding metallic surfaces presents a challenge. Conventionally, the heating process during the bonding, which causes the reflow of the metallic pattern, has been considered sufficient to cause bonding. Unfortunately, the non-uniformity and the difference in the distances between bonding metallic surfaces does not always allow for adequate bonding via reflow, resulting in low yields.

SUMMARY OF THE INVENTION

Bonding of substrates including metal-dielectric patterns on a surface with the metal raised above the dielectric is disclosed. One method includes providing a first substrate having a metal-dielectric pattern on a surface thereof; providing a second substrate having a metal-dielectric pattern on a surface thereof; performing a process resulting in the metal being raised above the dielectric in at least one of the substrates; cleaning the metal; and bonding the first substrate to the second substrate. A related structure is also disclosed. The bonding of raised metal provides a strong bonding medium, and good electrical and thermal connections enabling creation of three dimensional integrated structures with enhanced functionality.

A first aspect of the invention includes a method comprising: providing a first substrate having a metal-dielectric pattern on a surface thereof; providing a second substrate having a metal-dielectric pattern on a surface thereof; performing a process resulting in the metal being raised above the dielectric in at least one of the substrates; cleaning the metal; and bonding the first substrate to the second substrate.

A second aspect of the invention includes a structure comprising: a substrate including a dielectric having a metal therein, the metal extending above a surface of the dielectric and including an upper surface having at least a portion thereof in a substantially convex form.

A third aspect of the invention includes a method comprising: providing a first substrate having a metal-dielectric pattern on a surface thereof; providing a second substrate having a metal-dielectric pattern on a surface thereof; recessing the dielectric in at least one of the substrates by performing chemical mechanical polishing of the dielectric, and performing an etch; cleaning the metal; bonding the first substrate to the second substrate; and annealing the first substrate and the second substrate.

A fourth aspect of the invention includes a method comprising: providing a first substrate including a dielectric having a metal-dielectric pattern on a surface thereof with metal recessed; providing a second substrate having a metal-dielectric pattern on a surface thereof with dielectric recessed below metal by performing chemical mechanical polishing of the dielectric, and performing an etch; providing the lock-n-key ability, then cleaning the metal surface; bonding the first substrate to the second substrate; and annealing the bonded stack.

A fifth aspect of the invention includes a structure having: a first substrate having a metal-dielectric pattern on a surface thereof, the metal-dielectric pattern including: a metal having a concave upper surface; and a dielectric having a substantially uniform upper surface, wherein the metal on the first substrate is raised above the dielectric on the first substrate; and a second substrate bonded with the first substrate, the second substrate including: a dielectric; and a metal positioned substantially below the dielectric below the dielectric of the second substrate, wherein the first substrate and the second substrate are bonded at the metal from the first substrate and the metal from the second substrate.

A sixth aspect of the invention includes a structure having: a first substrate having a metal-dielectric pattern on a surface thereof, the metal-dielectric pattern including: a metal having a convex-dome shape; and a dielectric having a substantially uniform upper surface, wherein the metal on the first substrate is raised above the dielectric on the first substrate; and a second substrate bonded with the first substrate, the second substrate including: a dielectric; and a metal positioned substantially below the dielectric below the dielectric of the second substrate, wherein the first substrate and the second substrate are bonded at the metal from the first substrate and the metal from the second substrate.

A seventh aspect of the invention includes a structure having: a first substrate having a metal-dielectric pattern on a surface thereof, the metal-dielectric pattern including: a metal having a concave upper surface; and a dielectric having a substantially uniform upper surface, wherein the metal on the first substrate is raised above the dielectric on the first substrate; and a second substrate bonded with the first substrate, the second substrate including: a dielectric; and a metal positioned substantially below the dielectric of the second substrate, wherein the first substrate and the second substrate are bonded only at the metal from the first substrate and the metal from the second substrate.

An eight aspect of the invention includes a structure having: a first substrate having a metal-dielectric pattern on a surface thereof, the metal-dielectric pattern including: a metal having a concave upper surface including a metal cap; and a dielectric having a substantially uniform upper surface, wherein the metal on the first substrate is raised above the dielectric on the first substrate; and a second substrate bonded with the first substrate, the second substrate including: a dielectric; and a metal positioned substantially below the dielectric of the second substrate, wherein the first substrate and the second substrate are bonded at the metal from the first substrate and the metal from the second substrate, and wherein the bonded metals of the first substrate and the second substrate are bonded substantially seamlessly.

A ninth aspect of the invention includes a structure having: a first substrate having a metal-dielectric pattern on a surface thereof, the metal-dielectric pattern including: a metal having a concave upper surface including a metal cap; and a dielectric having a substantially uniform upper surface, wherein the metal on the first substrate is raised above the dielectric on the first substrate; and a second substrate bonded with the first substrate, the second substrate including: a dielectric; and a metal positioned substantially below the dielectric of the second substrate, wherein the first substrate and the second substrate are bonded only at the metal from the first substrate and the metal from the second substrate, wherein the bonded metals of the first substrate and the second substrate are bonded substantially seamlessly, and wherein the bonded metal of the first substrate and the metal of the second substrate are bonded at a temperature less than approximately 400 degrees Celsius.

The illustrative aspects of the present invention are designed to solve the problems herein described and/or other problems not discussed.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which:

FIGS. 1-3 and 5 show one embodiment of raising a metal above a dielectric for bonding according to the invention.

FIG. 6 shows an optional process according to one embodiment of the invention.

FIGS. 7-8 show one embodiment of bonding according to the invention.

FIG. 9 shows an optional anneal according to one embodiment of the invention.

FIGS. 10-11 show an optional bonding according to an alternative embodiment of the invention.

FIGS. 12-13 show an alternative embodiment of raising a metal above a dielectric for bonding according to the invention.

FIG. 16A shows an optional anneal according to one embodiment of the invention applied to the embodiment of FIGS. 12-15.

FIG. 17A shows an optional bonding according to an alternative embodiment of the invention applied to the embodiment of FIGS. 12-13.

FIGS. 18-22 show an alternative embodiments of roughening a raised metal for bonding and bonding according to the invention.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION

Figure 4A:
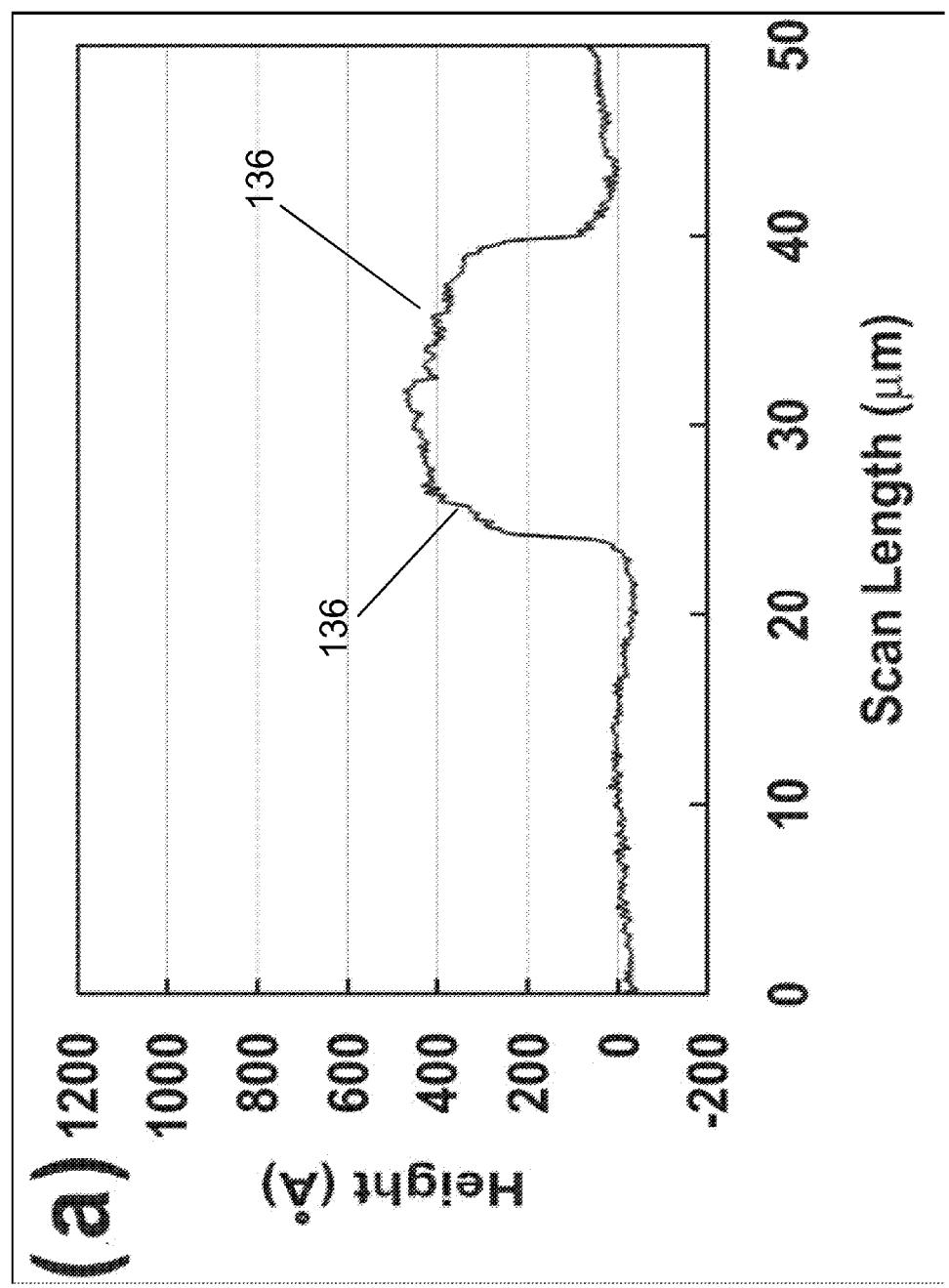
FIGS. 4A-C show graphs illustrating metal profiles according to various embodiments of raising a metal above a dielectric according to the invention.

Turning to the drawings, FIGS. 1-9 show one embodiment of a method of bonding according to the invention. FIG. 1 shows a substrate 100 having a metal-dielectric pattern 102 on a surface 104 thereof. As will be described herein, two substrates 100 having metal-dielectric patterns 102 will ultimately be provided and bonded together. Metal-dielectric pattern 102 includes a metal 110 such as a wire or contact positioned within a dielectric 112. It is understood that the layout of metal 110 within the different substrates may vary according to the functioning of the integrated circuit (IC) formed thereby. Metal 110 may include any now known or later developed metallic material 114, e.g., copper, tungsten, aluminum, etc., or combination thereof. In addition, metal 110 may include an oxide layer 116 thereover, e.g., where it has been exposed to the environment. Dielectric 112 may include any now known or later developed insulator material usable in bonded substrates 100, e.g., silicon dioxide ($SiO_2$), silicon nitride ($Si_3N_4$) or low-k dielectrics.

Substrate 100 may be formed using any now known or later developed techniques such as damascene processing, chemical mechanical polishing (CMP), etc. As shown in FIG. 1, metal 110 has a concave upper surface 118 caused by CMP, which may exist in oxide layer 116 and/or metallic material 114. Each substrate 100 may be exposed to CMP. Other layers 120 such as other interconnect layers, a silicon substrate, etc., may be provided under metal-dielectric pattern 102.

Figure 4B:
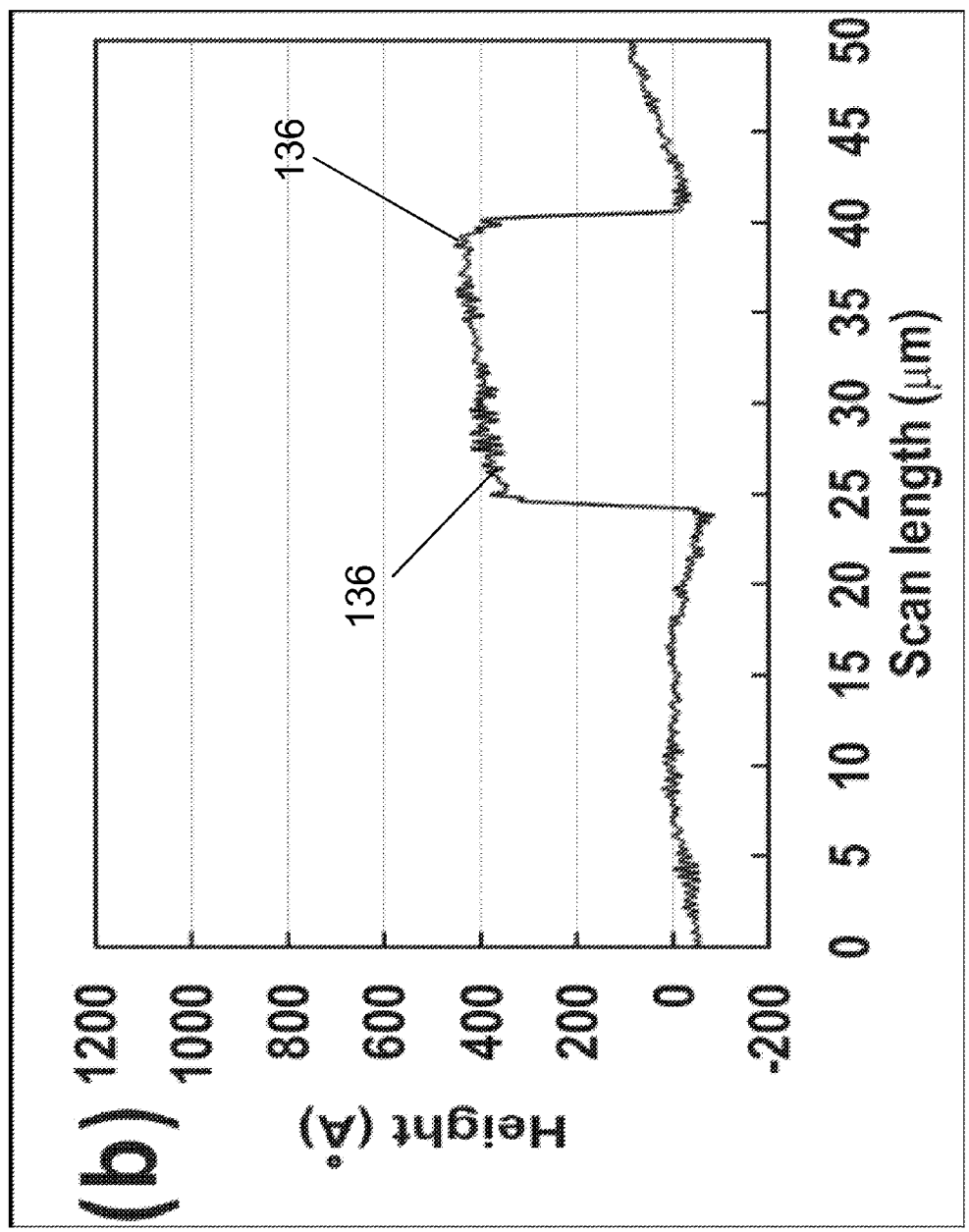
Figure 4C:
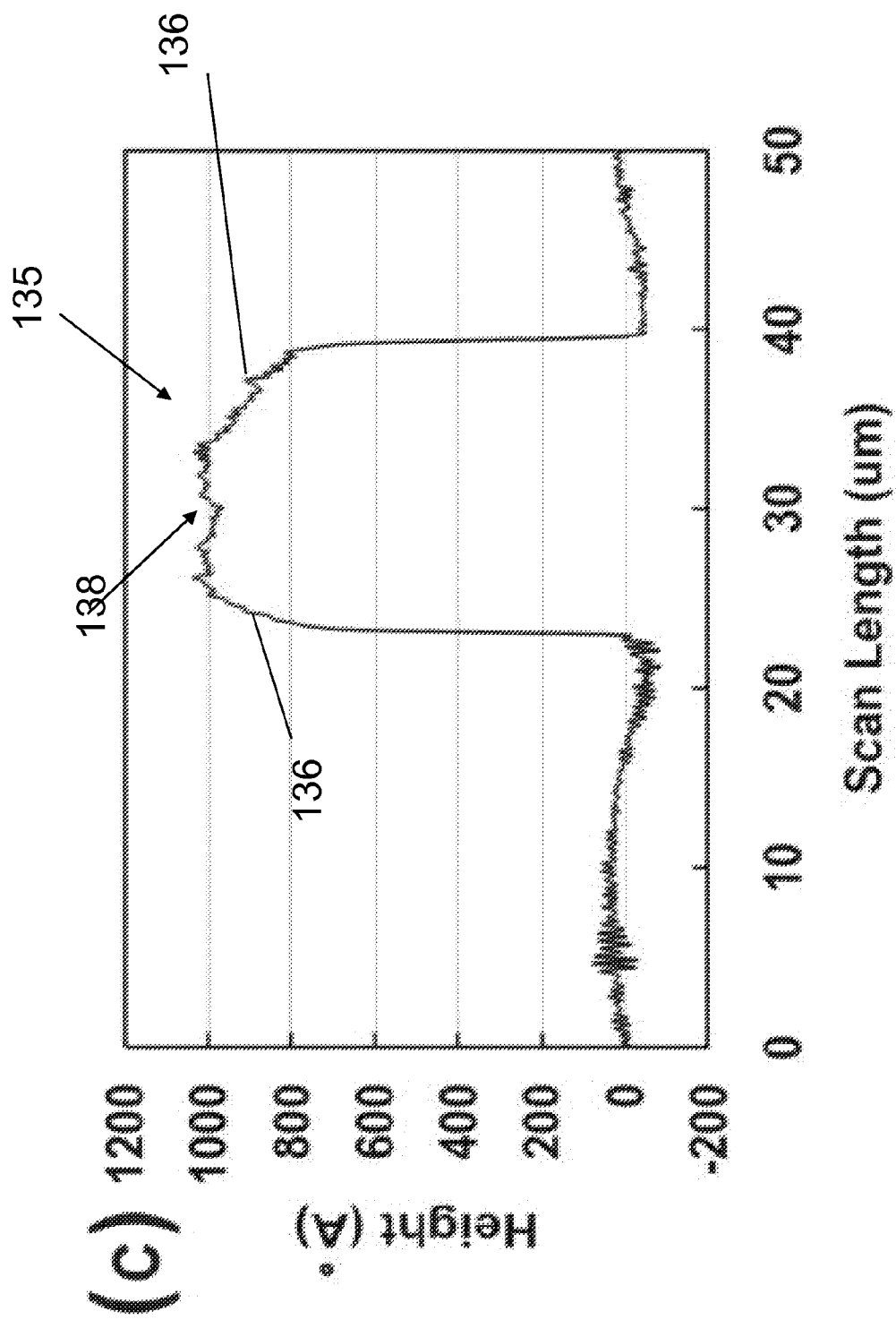
Figure 14:
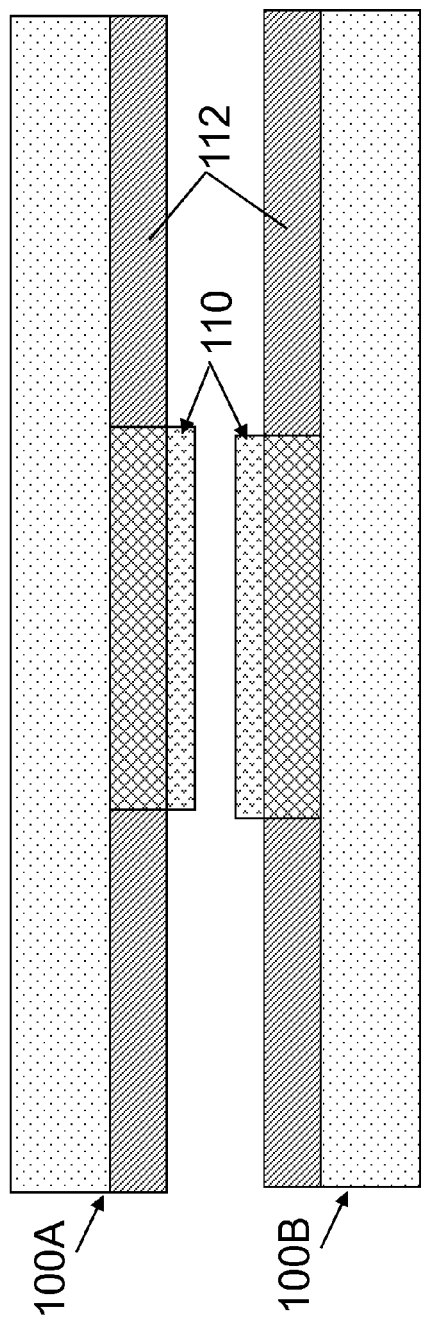
FIGS. 14-15 show one embodiment of bonding the FIGS. 12-13 embodiment according to the invention.

Next, a process is performed resulting in metal 110 being raised above dielectric 112 in at least one of substrates 100 that will be bonded together. FIGS. 2-3 show one embodiment of this process in which dielectric 112 is recessed. This embodiment may include one or more processes. FIG. 2 shows one process in which dielectric 112 is chemical mechanical polished (CMP) 130 to recess dielectric 112. FIG. 4A shows a graph illustrating a height of metal 110 compared to dielectric 112 according to one illustrative structure exposed to the CMP of FIG. 2 alone. FIG. 3 shows another process in which dielectric 112 is exposed to a wet etch 134 to recess dielectric 112. In one embodiment, where dielectric 112 includes silicon dioxide ($SiO_2$), wet etch 134 may include a diluted hydrofluoric acid (HF) etch; however, other etch process are also considered within the scope of the invention. FIG. 4B shows a graph illustrating a height of metal 110 compared to dielectric 112 according to one illustrative structure exposed to wet etch 134 of FIG. 3 alone. In another embodiment, substrate 100 is exposed to both CMP 130 of FIG. 2 and wet etch 134 of FIG. 3. FIG. 4C shows a graph illustrating a height of metal 110 compared to dielectric 112 according to one illustrative structure exposed to CMP 130 of FIG. 2 and wet etch 134 of FIG. 3. FIGS. 4A-4C show that metal 110 is raised above dielectric 112, and may include an upper surface 135 having at least a portion 136 thereof in a substantially convex form, e.g., rounded off. (Upper surface 135 is labeled in FIGS. 2 and 3 also, but the substantially convex form is not as recognizable due to limitations of the drawings.) In some instances, upper surface 135 may have a substantially domed shape 138, as shown best in FIG. 4C. In either case, any concave upper surface 118 (FIG. 1) is removed in this process, which fosters better metal-to-metal bonding.

FIG. 5 shows cleaning 140 of metal 110, e.g., etching of any oxide layer 116 (FIGS. 1-3) off of metal 110. The etching may include any now known or later developed etching technique for removing any dielectric used (e.g., silicon dioxide, silicon nitride) from a metal, e.g., a reactive ion etch, a wet etch, etc.

FIG. 6 shows an optional process of performing a metal surface neutralization process. In one embodiment, this process may include forming a layer 142 of benzotriazole (BTA) on metal 110. BTA layer 142 prevents further oxidation.

FIGS. 7-8 show bonding a first substrate 100A to a second substrate 100B. As shown in FIG. 7, each of substrates 100A, 100B have been exposed to the above described process. However, it is understood that it may be possible to carry out the bonding with only one of substrates 100A, 100B exposed to the process to raise metal 110 above dielectric 112, described herein. Bonding may include any now known or later developed thermal compression techniques. BTA layer 142 (FIG. 6) dissolves at high temperature. FIG. 8 shows a completed bonded structure 160 including first substrate 100A coupled to second substrate 100B by metal 110 of each respective substrate. In this case, bonding includes bonding only metal 110 of first substrate 100A and second substrate 100B because dielectric 112 is substantially recessed. As a result, a gap 162 is present between dielectric 112 of each respective substrate.

FIG. 9 shows a bonded structure 168 after an optional annealing 166. As shown in FIG. 8, typically, a low temperature (<400° C.) quick (<1 hr) thermo-compression bonding (FIG. 7) results in a clearly visible interface (or seam) 164 between metal 110 of each respective substrate 100A, 100B. An optimized post-bond annealing 166 provides the time and temperature needed for the interfacial grain growth enabling seam free interface (FIG. 9). In addition, annealing 166 allows for lower thermo-compression bond temperatures (FIG. 7) and higher process load/through-put through the bonding process (FIG. 7-8) because substrates 100A, 100B can be processed in a batch (parallel processing) through annealing 166. Annealing 166 may therefore improve the yield of the bonding process and can be utilized to improve manufacturability of bonded structures 160, 168.

Turning to FIGS. 10-11, in an alternative embodiment, substrates 100A, 100B may be processed, as described above, in an optimized manner such that, when bonded, metal 110 (with or without BTA layer 142 (FIG. 6)) and dielectric 112 bond together, i.e., gap 162 (FIGS. 8-9) is eliminated. That is, the bonding includes bonding metal 110 of first substrate 100A and second substrate 100B, and dielectric 112 of first substrate 100A and second substrate 100B. In this case, metal 110 is raised only high enough such that when bonded, dielectrics 112 bond also. Bonded structure 170 (FIG. 11) exhibits enhanced bonding strength across the whole substrates 100A, 100B compared to that of FIGS. 7-9, and prevents potential contamination in gap 162 (FIGS. 8-9). FIG. 11 shows bonded structure 170 after an optional anneal, i.e., without an interface 164 (FIG. 8). It is understood, however, that the annealing may not be necessary.

Referring to FIGS. 12-13, in an alternative embodiment, the process resulting in metal 110 being raised above dielectric 112 in at least one of substrates 100 may be provided by raising metal 110, rather than recessing dielectric 112. In this case, processing begins with substantially the same structure as shown in FIG. 1, and as shown in FIG. 12, metal 110 is cleaned (similar to cleaning 140 FIG. 5), e.g., by an etching of any oxide layer 116 (FIG. 1) off of metal 110. The etching may include any now known or later developed etching technique for removing oxide layer 116 (FIG. 1) from a metal, e.g., a reactive ion etch, a wet etch, etc.

FIG. 13 shows forming a metal cap 182 over metal 110. Metal 182 may be any metal or metal alloy compatible with metallic material 114. As known to those with skill in plating, if metallic material 114 includes copper (Cu), metal cap 182 may include any thermal compression bondable metal such as copper or a copper alloy such as tin-copper (SnCu), titanium (Ti), etc. Metal cap 182 may be formed using any now known or later developed techniques, e.g., chemical vapor deposition, atomic layer deposition, etc.

Figure 15:
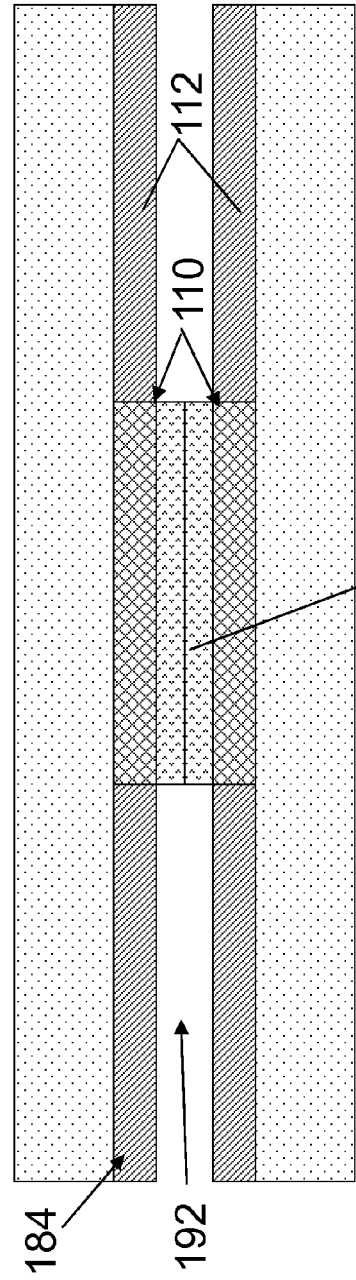
Figure 16B:
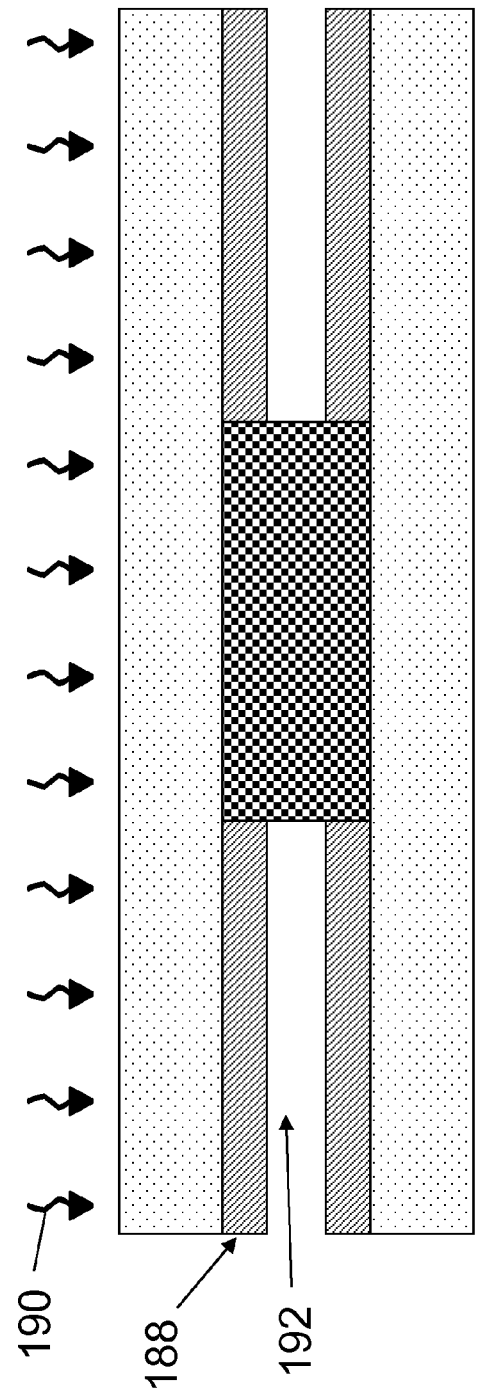
FIGS. 16B and 17B show an optional anneal and bonding, respectively, according to an alternative embodiment of invention applied to the embodiment of FIGS. 12-13.
Figure 17B:
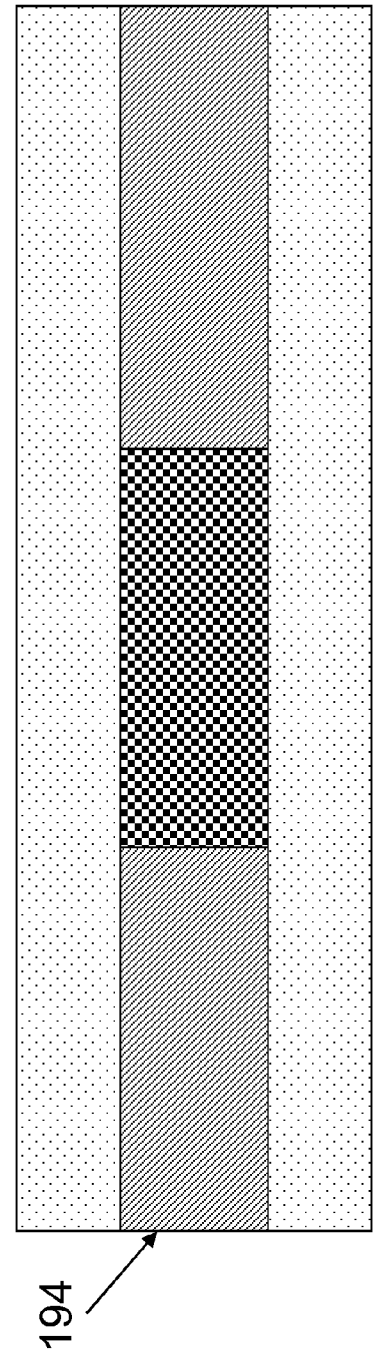

FIGS. 14-16A show bonding of substrates 100A, 100B formed using the process of FIGS. 12-13. The bonding is substantially similar to that described relative to FIGS. 7-9. FIG. 15 shows a bonded structure 184 after thermo-compression bonding, with an interface 186 therein. FIG. 16A shows a bonded structure 188 after an optional anneal 190. While FIGS. 15-16 show a gap 192, it is understood that this embodiment may also employ the optimization of FIGS. 10-11 to arrive at a bonded structure 194, as shown in FIG. 17A, without a gap 192 (FIG. 16). Note, FIG. 17A also includes the optional anneal 190 (FIG. 16A) to remove interface 186 (FIG. 15). As shown FIGS. 16B-17B, if metal 110 (FIG. 15) used easily diffuses into copper (Cu), then no interface may exist between the different metals, and they may meld into a unitary copper alloy.

FIGS. 18-22 show another alternative embodiment in which a metal 210 is roughened to have a roughened surface 298 prior to bonding. In some cases, where metal 210 is sufficiently high, a substantially domed shape 138 (FIG. 4C) upper surface 135 (FIG. 2) is advantageous compared to concave upper surface 118 (FIG. 1) which has raised edges. However, if metal 210 is not sufficiently raised, roughening of metal 210 to have a roughened surface 298 may aid in strengthening bonding. FIG. 18 shows roughening of metal 210 to include roughened surface 298, e.g., by etching such as RIE or a wet etch. FIG. 18 may be after the process to raise metal 210 according to any of the above-describe embodiments to raise metal 210. FIG. 18 shows metal 210 including an oxide layer 216, and FIG. 19 shows metal 210 after cleaning, e.g., etching to remove oxide layer 216 (FIG. 18) as described above relative to FIGS. 5 and 12. It is understood, however, that metal 210 may be roughened in the absence of oxide layer 216. FIG. 19 shows optional performing of a metal surface neutralization process. As described above relative to FIG. 6, this process may include forming a layer 242 of benzotriazole (BTA) on metal 210, which prevents further oxidation.

Figure 21:
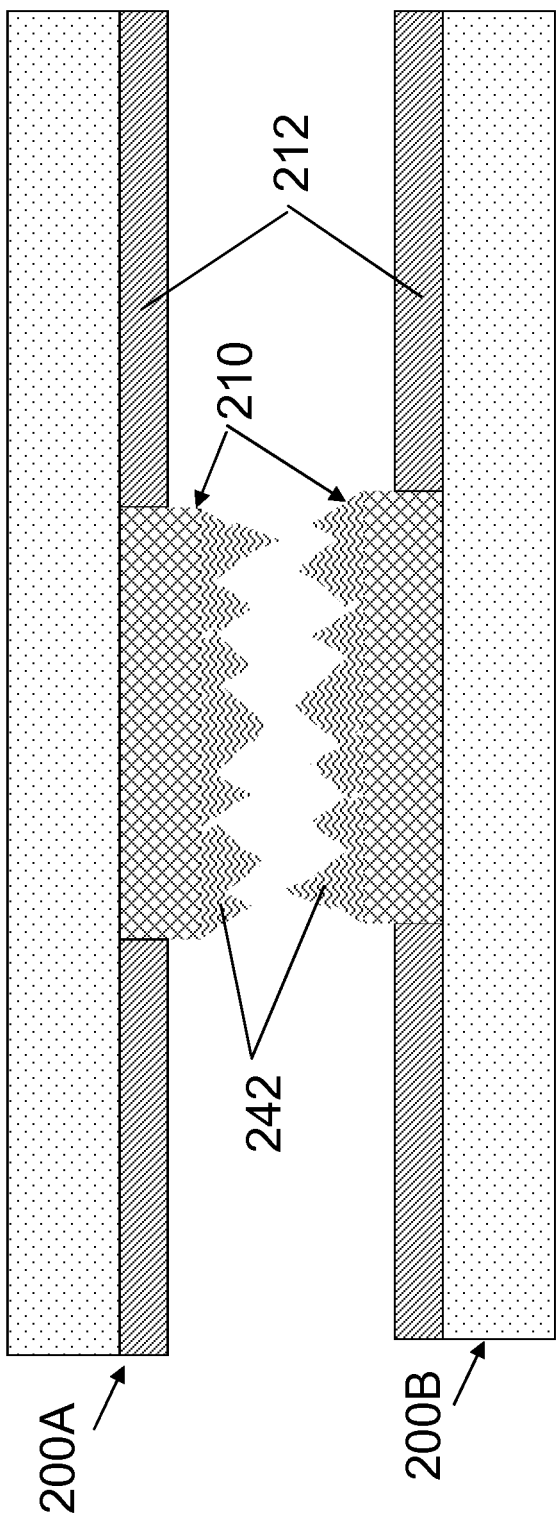
Figure 22:
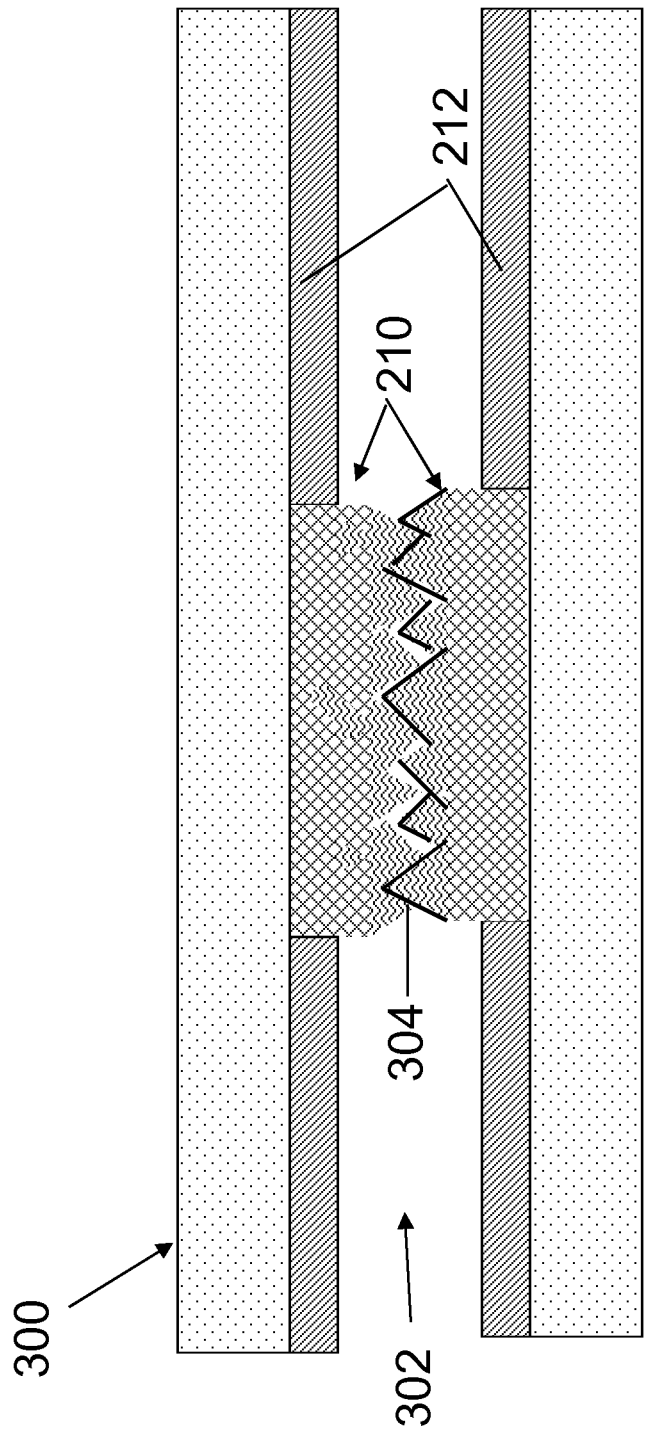

FIGS. 21-22 show bonding of substrates 200A, 200B formed according to the embodiments of FIGS. 18-20, resulting in a bonded structure 300 (FIG. 22). It is understood that while bonded structure 300 includes a gap 302 and an interface 304, it may be formed as described above relative to FIGS. 10-11 without gap 302, and/or, as described above relative to FIG. 9 without interface 304. If an optional anneal is performed, then interface 304 may be removed.

Figure 23:
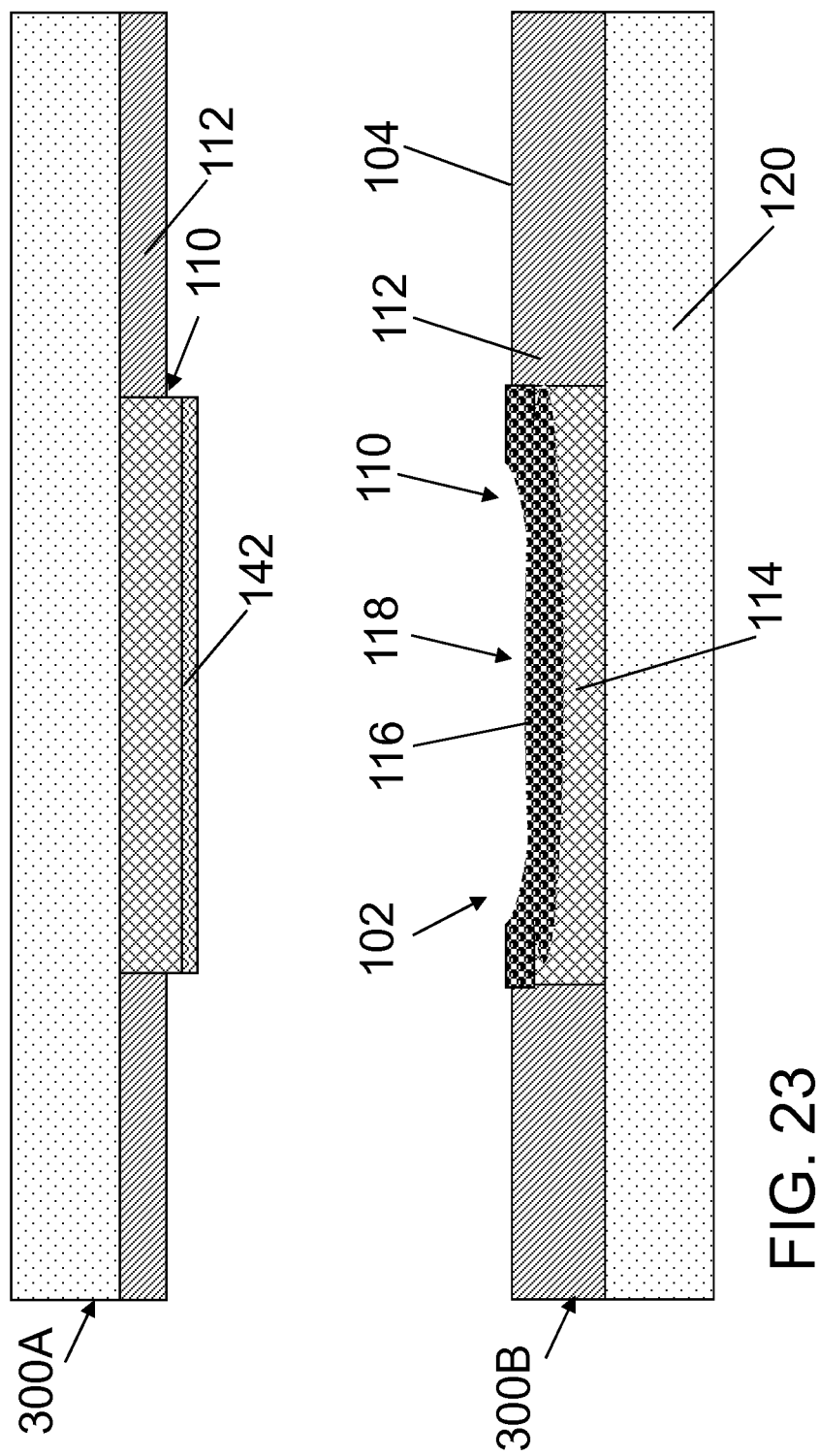
FIGS. 23-24 show an alternative embodiment of providing an interlocking option to enable bonding with good alignment accuracy.
Figure 24:
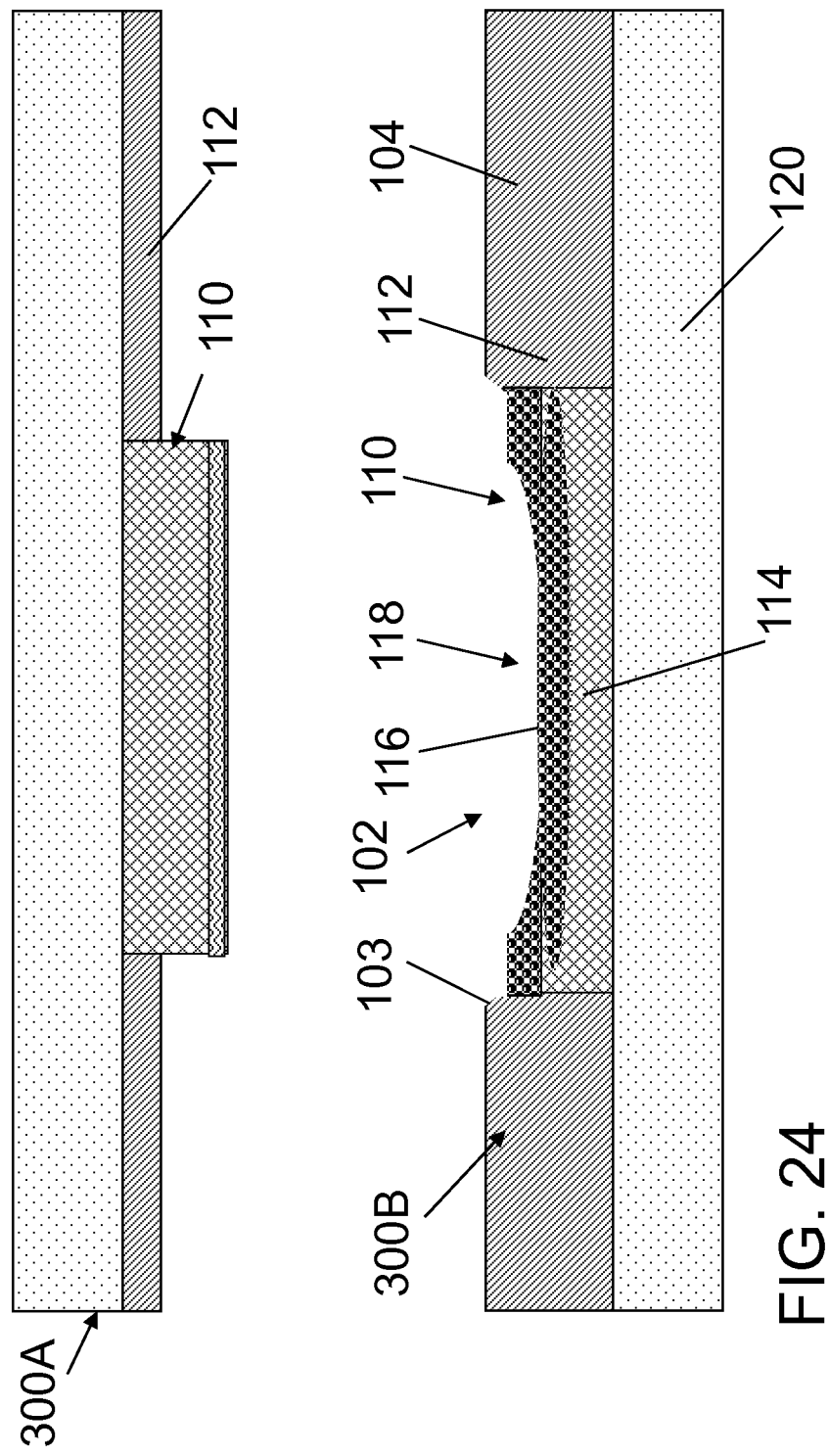

FIGS. 23-24 show another alternative embodiment in which substrates 300A, 300B may be bonded in an interlocking fashion. In this case, two substrates 300A, 300B each having substantially similar structure to that shown in FIG. 1 may be provided. Here, as shown in FIG. 23, one substrate 300A is processed according to one of the embodiments above to raise metal 110 above dielectric 112. A BTA layer 142 may or may not be provided on metal 110. In addition, a substrate 300B having a structure substantially similar to FIG. 1 may be provided. As shown in FIG. 24, substrate 300B is processed to raise dielectric 112 above metal 110, which may or may not include oxide layer 116. Dielectric 112 may be raised by deposition of more dielectric in any manner, e.g., masking metal 110 and deposition, or by recessing of metal 110 in any manner, e.g., masking dielectric 112 and etching metal 110. In one embodiment, metal 110 of substrate 300B may be wider than metal 110 of substrate 300A to accommodate mating, i.e., the opening in dielectric 112 is larger in substrate 300B. In one alternative embodiment, where necessary, dielectric 112 and/or metal 110 of substrate 300B may form an angled opening 103 to assist in mating with metal of substrate 300A. However, this may not be necessary in all instances. Substrates 300A, 300B may then be bonded according to any one of the above described embodiments such that metals 110 thereof interlock between dielectrics 112 thereof.

Returning to FIGS. 3 and 4C, in another embodiment, the invention may include a structure including substrate 100 including dielectric 112 having metal 110 therein. As described above, metal 110 extends above surface 104 of dielectric 112 and include an upper surface 135 having at least a portion 136 thereof in a substantially convex form. As shown in FIG. 4C, upper surface 135 (FIG. 3) may be substantially dome shaped 138.

The method as described above may be used in the fabrication of integrated circuit chips. In addition, the method may be employed in bonding of mechanical components, e.g., micro-electrical mechanical systems (MEMS), or optical components, such as a micro-optical bench. In the case of IC chips, the resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). Regardless of the method, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

What is claimed is:

1. A structure comprising:
a first substrate having a metal-dielectric pattern on a surface thereof, the metal-dielectric pattern including:
a metal having a concave upper surface, wherein the metal of the first substrate includes a metal cap; and
a dielectric having a substantially uniform upper surface,
wherein the metal on the first substrate is raised above the dielectric on the first substrate; and
a second substrate bonded with the first substrate, the second substrate including:
a dielectric; and
a metal positioned substantially below the dielectric of the second substrate,
wherein the first substrate and the second substrate are bonded only at the metal from the first substrate and the metal from the second substrate.

2. The structure of claim 1, wherein the bonded metals of the first substrate and the second substrate are bonded substantially seamlessly.

3. The structure of claim 1, wherein the metal of the second substrate is recessed below the dielectric of the second substrate.

4. The structure of claim 1, wherein the dielectric of the second substrate is built-up above the metal of the second substrate.

5. The structure of claim 1, wherein the bonded metal of the first substrate and the metal of the second substrate are bonded at a temperature less than approximately 400 degrees Celsius.

6. The structure of claim 1, wherein the metal from the first substrate directly contacts the metal from the second substrate.

7. A structure comprising:
a first substrate having a metal-dielectric pattern on a surface thereof, the metal-dielectric pattern including:
a metal having a concave upper surface including a metal cap; and
a dielectric having a substantially uniform upper surface,
wherein the metal on the first substrate is raised above the dielectric on the first substrate; and
a second substrate bonded with the first substrate, the second substrate including:
a dielectric; and
a metal positioned substantially below the dielectric of the second substrate,
wherein the first substrate and the second substrate are bonded at the metal from the first substrate and the metal from the second substrate, and
wherein the bonded metals of the first substrate and the second substrate are bonded substantially seamlessly.

8. The structure of claim 7, wherein the first substrate and the second substrate are bonded only by the metal of the first substrate and the metal of the second substrate.

9. The structure of claim 7, wherein the metal of the second substrate is recessed below the dielectric of the second substrate.

10. The structure of claim 7, wherein the dielectric of the second substrate is built-up above the metal of the second substrate.

11. The structure of claim 7, wherein the bonded metal of the first substrate and the metal of the second substrate are bonded at a temperature less than approximately 400 degrees Celsius.

12. The structure of claim 7, wherein the first substrate and the second substrate are bonded by the metal of the first substrate and the metal of the second substrate and the dielectric of the first substrate and the dielectric of the second substrate, respectively.

13. The structure of claim 7, wherein the metal from the first substrate directly contacts the metal from the second substrate.

14. A structure comprising:
   a first substrate having a metal-dielectric pattern on a surface thereof, the metal-dielectric pattern including:
      a metal having a concave upper surface including a metal cap; and
      a dielectric having a substantially uniform upper surface,
   wherein the metal on the first substrate is raised above the dielectric on the first substrate; and
   a second substrate bonded with the first substrate, the second substrate including:
      a dielectric; and
      a metal positioned substantially below the dielectric of the second substrate,
   wherein the first substrate and the second substrate are bonded only at the metal from the first substrate and the metal from the second substrate,
   wherein the bonded metals of the first substrate and the second substrate are bonded substantially seamlessly, and
   wherein the bonded metal of the first substrate and the metal of the second substrate are bonded at a temperature less than approximately 400 degrees Celsius.

* * * * *